United States Patent
Adlhoch, Jr. et al.

(10) Patent No.: US 9,739,829 B2
(45) Date of Patent: Aug. 22, 2017

(54) RESIDUAL-CURRENT-OPERATED PROTECTIVE ARRANGEMENT, CHARGING APPARATUS AND METHOD FOR CHECKING A RESIDUAL-CURRENT-OPERATED PROTECTIVE DEVICE

(71) Applicant: SIEMENS AKTIENGESELLSCHAFT, Munich (DE)

(72) Inventors: Manfred Adlhoch, Jr., Bernhardswald (DE); Alexander Mundry, Hengersberg (DE)

(73) Assignee: Siemens Aktiengesellschaft, Munich (DE)

( * ) Notice: Subject to any disclaimer, the term of this patent is extended or adjusted under 35 U.S.C. 154(b) by 19 days.

(21) Appl. No.: 14/730,440

(22) Filed: Jun. 4, 2015

(65) Prior Publication Data
US 2015/0355273 A1    Dec. 10, 2015

(30) Foreign Application Priority Data

Jun. 4, 2014   (DE) .................. 10 2014 210 589

(51) Int. Cl.
*G01R 31/327* (2006.01)
*G01R 31/28* (2006.01)

(52) U.S. Cl.
CPC ..... *G01R 31/2884* (2013.01); *G01R 31/3277* (2013.01)

(58) Field of Classification Search
CPC .............. G01R 19/0084; G01R 31/025; G01R 31/3187; G01R 19/165; G01R 19/2513; G01R 21/00; G01R 31/40; G01R 33/04; G01R 33/3852; G01R 35/04
USPC ........... 324/750.3, 51, 424, 132, 140 R, 133, 324/158.1, 76.11, 253, 117 R, 546
See application file for complete search history.

(56) References Cited

U.S. PATENT DOCUMENTS

| | | | | |
|---|---|---|---|---|
| 3,786,356 A | * | 1/1974 | MacPhee | ............... H02H 3/335 361/45 |
| 4,314,200 A | * | 2/1982 | Marek | .................. G01R 33/045 324/117 R |
| 5,644,238 A | * | 7/1997 | Seifert | ................... G01R 19/30 324/132 |
| 2011/0273139 A1 | * | 11/2011 | Hofheinz | .............. B60L 3/0023 320/109 |

FOREIGN PATENT DOCUMENTS

| | | | | |
|---|---|---|---|---|
| DE | 2943725 A1 | 5/1981 | | |
| DE | 2943725 C2 | * | 7/1984 | ....... G01R 19/16571 |
| DE | 102010032031 A1 | * | 1/2012 | ............. H01H 83/04 |

* cited by examiner

*Primary Examiner* — Jermele M Hollington
*Assistant Examiner* — Taqi Nasir
(74) *Attorney, Agent, or Firm* — Laurence Greenberg; Werner Stemer; Ralph Locher

(57) ABSTRACT

A residual-current-operated protective arrangement includes a residual-current-operated protective device that has a core and an evaluation coil. A control device is provided that has a detection unit for detecting an electric current flowing through the evaluation coil. The residual-current-operated protective arrangement has a test winding that is inductively coupled to the evaluation coil via the core and the control device has a testing unit for impressing a predetermined test current into the test winding.

6 Claims, 1 Drawing Sheet

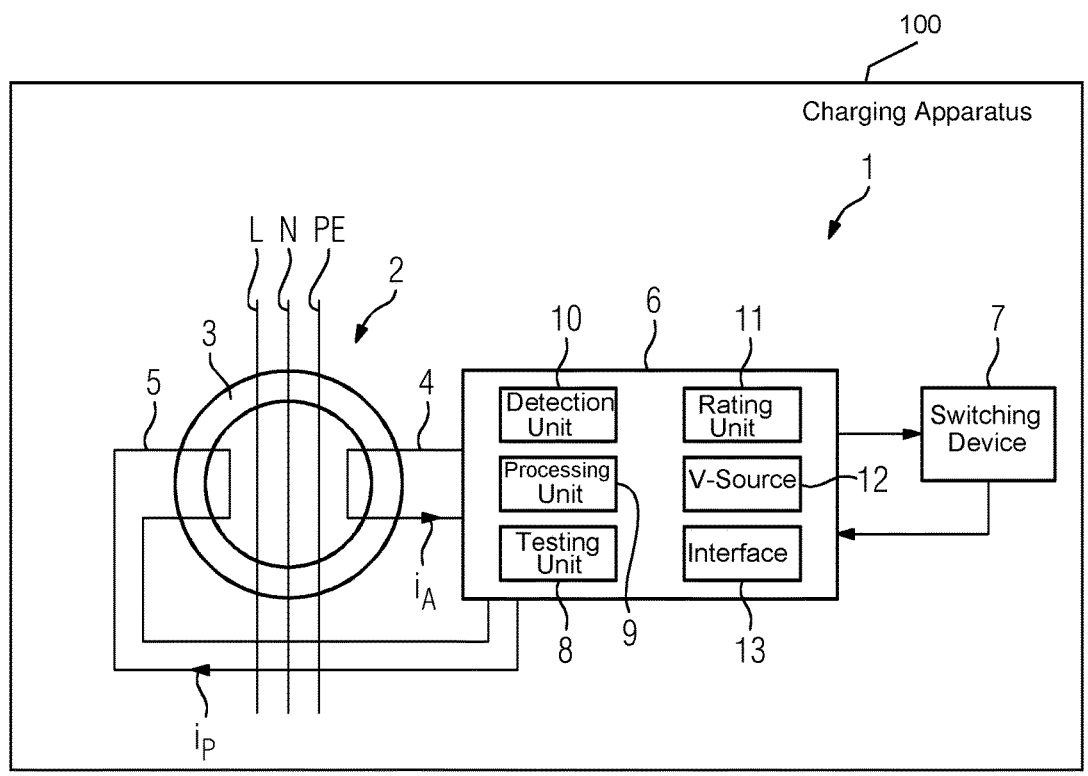

RESIDUAL-CURRENT-OPERATED PROTECTIVE ARRANGEMENT, CHARGING APPARATUS AND METHOD FOR CHECKING A RESIDUAL-CURRENT-OPERATED PROTECTIVE DEVICE

CROSS-REFERENCE TO RELATED APPLICATION

This application claims the priority, under 35 U.S.C. §119, of German application DE 10 2014 210 589.7, filed Jun. 4, 2014; the prior application is herewith incorporated by reference in its entirety.

BACKGROUND OF THE INVENTION

Field of the Invention

The present invention relates to a residual-current-operated protective arrangement having a residual-current-operated protective device that has a core and an evaluation coil, and a control device that has a detection unit for detecting an electric current flowing through the evaluation coil. Furthermore, the invention relates to a charging apparatus for an electrical energy store in a motor vehicle having a residual-current-operated protective arrangement of the aforementioned type. Finally, the present invention relates to a method for checking a residual-current-operated protective device.

Residual-current-operated protective devices are known from the prior art. By way of example, they are used in electrical installations to avoid fault currents to ground and hence to prevent life-threatening electrical accidents. In this case, line-voltage-independent residual-current-operated protective devices are known, which are referred to as residual-current-operated circuit breakers (FI). In addition, line-voltage-dependent residual-current-operated protective devices are known, which are referred to as differential current circuit breakers (DI).

Such residual-current-operated protective devices usually have a summation current transformer. The summation current transformer has a core, in particular an annular core, through which the electrical conductors which are to be checked for a fault current are routed. The summation current transformer also has a tripping coil which is placed around the core. When a fault current occurs, the sum of all of the currents through the electrical conductors is not equal to zero. In this case, an electrical voltage is induced in the evaluation coil or an electric current flows through the evaluation coil. This current can be detected by a control device and an appropriate switching device can be actuated to electrically isolate the electrical conductors. To test for correct functioning, the residual-current-operated protective devices usually have an appropriate test key that, when operated, electrically connects an electrical conductor having a suitably dimensioned resistance to the neutral conductor. This produces a fault current that can be detected using the control device. For example, the test key can be used to perform a twice yearly test on the residual-current-operated protective devices.

Residual-current-operated protective devices are also used in the field of charging apparatuses for electrical energy stores in motor vehicle. Both in the case of an electrical installation and a charging apparatus for an electric vehicle, dangerous AC fault currents and also DC fault currents can arise. In the case of electrical installations, it is then necessary to use a residual-current-operated protective device that is sensitive to direct and alternating current or a type-B residual-current-operated circuit breaker.

Failure identification for a residual-current-operated protective device in the field of charging apparatuses has been known to date only for type-A differential current circuit breakers. These residual-current-operated protective devices can detect sinusoidal alternating currents and pulsating DC fault currents. Such a residual-current-operated protective device is operated autonomously, independently of a control device or microcontroller device. In this case, the monitoring is limited only to AC self-test signals, however.

SUMMARY OF THE INVENTION

It is an object of the present invention to demonstrate a solution to how a failure in a residual-current-operated protective device of the type cited at the outset can be identified more reliably.

The invention achieves this object by a residual-current-operated protective arrangement, by a charging apparatus and by a method having the features according to the respective independent patent claims. Advantageous embodiments of the invention are the subject matter of the dependent patent claims, the description and the FIGURE.

The residual-current-operated protective arrangement according to the invention contains a residual-current-operated protective device that has a core and an evaluation coil, and a control device that has a detection unit for detecting an electric current flowing through the evaluation coil. Furthermore, the residual-current-operated protective arrangement has a test winding that is inductively coupled to the evaluation coil via the core. In addition, the control device has a testing unit for impressing a predetermined test current into the test winding.

According to the invention, impressing the test current into the test winding therefore allows a test fault current to be produced that can be used to facilitate an internal self-test on the residual-current-operated protective arrangement. The residual-current-operated protective apparatus contains a summation current transformer that contains an annular core, for example. The electrical conductor to be monitored runs through the core. The annular core can have first the evaluation coil and second the test winding wound around it. When the testing unit is used to impress the predetermined test current or a predetermined test voltage into the test winding, a test fault current is introduced in the evaluation coil. This test fault current can be detected using the detection unit of the control device. This allows failure identification for the residual-current-operated protective device to be performed.

Preferably, the testing unit is configured to impress the predetermined test current into the test winding at predetermined instants. In particular, the testing unit may be configured to impress the predetermined test current into the test winding periodically within predetermined intervals of time. This allows a fully automatic self-test on the residual-current-operated protective device to be facilitated. Hence, there is no need for a manual check on the residual-current-operated protective device that involves an appropriate test key being pressed, for example.

In one embodiment, the testing unit is configured to impress a direct current and/or a pulsed direct current into the test winding as the predetermined test current. In this way, it is possible to check whether the residual-current-operated protective device reacts to DC fault currents in a reliable manner. Alternatively or additionally, it is possible to check whether the residual-current-operated protective device trips in a reliable manner in the event of pulsed DC fault currents.

In addition, it is advantageous if the testing unit is configured to impress an alternating current into the test winding as the predetermined test current. In this way, it is possible to check whether the residual-current-operated protective device trips in a reliable manner in the event of an AC fault current. Provision may also be made for a high-frequency alternating current, which has frequencies of several kHz, for example, to be impressed into the test winding.

In a further refinement, the control device has an auxiliary voltage source for supplying electric power to the control device. In other words, the residual-current-operated protective device is in the form of what is known as a differential current circuit breaker. This can be used for line-voltage-dependent appliances.

In addition, it is advantageous if the residual-current-operated protective arrangement has a switching device for electrically isolating at least one electrical conductor. The switching device can also be referred to as a tripping unit or as a breaker mechanism. This is used to electrically isolate at least one electrical conductor when a fault current is identified. The switching device may contain a power semiconductor, for example a transistor or a thyristor.

In one embodiment, the control device has a rating unit for rating the electric current detected using the detection unit and for actuating the switching device on the basis of the rating. By way of example, the rating unit can store a threshold value for the current intensity of the electric current that is detected using the detection unit. If the threshold value is exceeded, the rating unit can be used to output an appropriate control signal to the switching device. This allows the residual-current-operated protective arrangement to be operated in a reliable manner.

In a further embodiment, the control device has a processing unit for filtering and/or amplifying the electric current flowing through the evaluation coil. By way of example, the processing unit can have an appropriate amplifier circuit that can be used to boost the electric current flowing through the evaluation coil. Alternatively or additionally, the processing unit can have appropriate electrical filters that can be used to filter the electric current as appropriate. In this way, it is possible to filter out interference, for example.

The charging apparatus according to the invention for an electrical energy store in a motor vehicle contains the residual-current-operated protective arrangement according to the invention. By way of example, the residual-current-operated protective arrangement may be arranged in a charging cable, what is known as a wall box or a charging station. The charging apparatus can also be referred to as electric vehicle supply equipment (EVSE). Such a charging apparatus is described in IEC Standard 61851-1. Hence, a residual-current-operated protective device with integrated self-monitoring can also be provided for a charging apparatus for an electrical energy store in an electric vehicle or a hybrid vehicle.

The method according to the invention for checking a residual-current-operated protective device that has a core and an evaluation coil contains the detection of an electric current flowing through the evaluation coil by a detection unit of a control device, the provision of a test winding that is inductively coupled to the evaluation coil via the core and the impressing of a predetermined test current into the test winding using a testing unit of the control device.

The preferred embodiments and advantages thereof that have been presented with reference to the residual-current-operated protective arrangement according to the invention apply accordingly to the charging apparatus according to the invention and to the method according to the invention.

Further features of the invention will emerge from the claims, the FIGURE and the description of the FIGURE. All features and combinations of features that have been cited above in the description and the features and combinations of features that are cited below in the description of the FIGURE and/or that are shown in the FIGURE alone can be used not only in the respectively indicated combination but also in other combinations or else on their own.

Other features which are considered as characteristic for the invention are set forth in the appended claims.

Although the invention is illustrated and described herein as embodied in a residual-current operated protective arrangement, a charging apparatus and a method for checking a residual-current-operated protective device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWING

The single FIGURE of the drawing is a block diagram of a residual-current-operated protective arrangement according to the invention.

DETAILED DESCRIPTION OF THE INVENTION

Referring now to the FIGURE of the drawing in detail, there is shown a block diagram of a residual-current-operated protective arrangement 1 being a part of a charging apparatus 100. The residual-current-operated protective arrangement 1 contains a residual-current-operated protective device 2. The residual-current-operated protective device 2 in turn contains a summation current transformer that has a core 3. In the present exemplary embodiment, the core 3 is in annular form. By way of example, the core 3 may be made from a soft iron or a ferrite. The core 3 has the electrical conductors routed through it that are intended to be checked for the presence of a fault current. In the present case, a phase L, a neutral conductor N and a protective conductor PE are routed through the core 3. Furthermore, the residual-current-operated protective device 2 or the summation current transformer contains an evaluation coil 4 that is inductively coupled to the electrical conductors via the core 3. In the present exemplary embodiment, the evaluation coil 4 contains a conductor loop that is routed around the core 3. The evaluation coil 4 may also have a plurality of turns that are wound around the core 3 at least in regions.

If there is no fault current present, then the sum of the currents flowing through the electrical conductors is equal to zero. In this case, the magnetic alternating fields that surround the electrical conductors also cancel one another out. In this case, no voltage is induced in the evaluation coil. If a fault current occurs, a partial current flows away via the ground or via the protective conductor PE. In this case, the sum of all currents in the electrical conductors is not equal to zero. In this case, a voltage is induced in the evaluation coil 4. Therefore, an electric current $i_A$ flows through the evaluation coil 4.

The residual-current-operated protective arrangement 1 additionally contains a control device 6 that may be in the form of a microcontroller, for example. Alternatively, the control device 6 may be in the form of an analog circuit.

The control device 6 contains a processing unit 9 that is electrically coupled to the evaluation coil 4. The processing unit 9 can have appropriate electrical filters for filtering the electric current $i_A$ that flows through the evaluation coil 4. Alternatively or additionally, the processing unit 9 can have an appropriate amplifier circuit for boosting the electric current $i_A$ that flows through the evaluation coil 4. Furthermore, the control device 6 contains a detection unit 10 that is configured to detect the electric current $i_A$ flowing through the evaluation coil 4. In particular, the detection unit 10 is electrically connected to the processing unit 9, so that the filtered and/or boosted electric current intensity is transmitted to the detection unit 10.

Furthermore, the control device 6 contains a rating unit 11 that is connected to the detection unit 10 for data transmission. By way of example, the rating unit 11 can store a threshold value for the electric current intensity of the current $i_A$ that flows through the evaluation coil. If the threshold value is exceeded, the rating unit 11 is configured to transmit an appropriate control signal to a switching device 7 of the residual-current-operated protective arrangement 1. In particular, the detection unit 10 and the rating unit 11 are configured to detect DC fault currents, pulsed DC fault currents and AC fault currents. In particular, the detection unit 10 and the rating unit 11 are configured to safely identify DC fault currents upward of 6 mA.

The switching device 7 can contain appropriate contactors. Alternatively or additionally, the switching unit 7 can contain appropriate power semiconductor switches, such as transistors, thyristors, IGBTs or the like. The switching device 7 is preferably configured for all-pole disconnection of the electrical conductors. That is to say that the switching device 7 interrupts the flow of current through the neutral conductor N and the phase L.

Furthermore, the control device 6 contains an interface 13 via which the control device 6 can receive data. Alternatively or additionally, the control device 6 can output data via the interface 13. Finally, the control device 6 contains an auxiliary voltage source 12 that can be used to supply electric power to the control device 6. The residual-current-operated protective arrangement is thus suitable for line-voltage-independent appliances. The residual-current-operated protective arrangement 1 is particularly in the form of a differential current circuit breaker (DI).

In addition, the residual-current-operated protective arrangement 1 contains a test winding 5. In the present exemplary embodiment, the test winding 5 contains a conductor loop that surrounds the annular core 3 at least in regions. Alternatively, the test winding 5 may have a plurality of turns that surround the core 3 at least in regions. The test winding 5 is thus inductively coupled to the evaluation coil 4 via the core 3.

Furthermore, the control device 6 contains a testing unit 8 that can be used to output a test current $i_P$ and to impress it into the test winding 5. For this purpose, the testing unit 8 can have an appropriate signal generator. In the simplest case, the latter can output a high signal and/or a low signal at its output. In this way, a direct current or a pulsed direct current can be impressed into the test winding 5 as the predetermined test current $i_P$. Alternatively or additionally, the testing unit 8 may be configured to impress an alternating current, which can have a frequency of 50 Hz or 60 Hz, for example, into the test winding 5 as the test current $i_P$. In addition, it is conceivable for the testing unit 8 to be configured to impress a high-frequency alternating current, which has a frequency of several kHz, for example, into the test winding 5 as the test current $i_P$.

Owing to the test current $i_P$ that is impressed into the test winding 5, a voltage is induced via the evaluation coil 4, the voltage resulting in a flow of current $i_A$. The electric current can be filtered or boosted as appropriate using the processing unit 9 and detected using the detection device 10. If the electric current $i_A$ exceeds a predetermined threshold value, the rating unit 11 can be used to output an appropriate control signal to the switching device 7. This allows a reliable check to determine that the residual-current-operated protective device 2 is operational. In this case, provision may also be made for the testing unit 8 to be configured to impress the predetermined test current $i_P$ into the test winding 5 periodically at predetermined instants. It is thus possible for a self-test to be performed in predetermined periods, for example.

If the result of the check is that the residual-current-operated protective device 2 is not serviceable, an appropriate signal can be output, for example. For this purpose, an appropriate display element may be provided on the control device 6. Alternatively or additionally, an appropriate signal can be output via the interface 13. In addition, provision may be made for the switching device 7 to be opened if the residual-current-operated protective device 2 is not serviceable.

The testing unit 8 may also be configured to impress into the test winding 5 such a test current $i_P$ as prompts, in the evaluation coil 4, an electric current $i_A$ whose current intensity is below the threshold value. Hence, although the current flowing through the evaluation coil 4 can be detected by the detection unit 10, the switching device 7 is not tripped in this case. When the detection unit 10 has reliably identified the test fault current, an appropriate signal can be output via the interface 13, for example.

The residual-current-operated protective arrangement 1 can be used particularly in charging apparatuses for electric vehicles or hybrid vehicles. In this context, there is an electrical connection between a power supply system and an electrical energy store in the motor vehicle. This electrical connection or the electrical conductors can be reliably monitored using the residual-current-operated protective arrangement 1. The residual-current-operated protective arrangement 1 can be used to identify both DC fault currents and AC fault currents. In particular, DC fault currents upward of 6 mA that occur in charging apparatuses for electric vehicles can be safely identified. In addition, the separate test winding 5 and the testing unit 8, which is integrated into the control device 6, provide a self-test function.

In summary, the invention therefore relates to a residual-current-operated protective arrangement 1 having the residual-current-operated protective device 2 that has the core 3 and the evaluation coil 4 and having the control device 6 that has the detection unit 10 for detecting an electric current $i_A$ flowing through the evaluation coil 4. The residual-current-operated protective arrangement 1 has a test winding 5 that is inductively coupled to the evaluation coil 4 via the core 3 and wherein the control device 6 has a testing unit 8 for impressing a predetermined test current $i_p$ into the test winding 5.

The invention claimed is:

1. A charging system for an electrical energy store of a motor vehicle, the charging system comprising:
    a charging apparatus, containing:
        a residual-current-operated protective configuration, containing:
            a residual-current-operated protective device having a core and an evaluation coil;
            a control device having a detection unit for detecting an electric current flowing through said evaluation coil;
            a test winding inductively coupled to said evaluation coil via said core; and
            said control device having a testing unit for impressing a predetermined test current into said test winding and an auxiliary voltage source for supplying electric power to said control device, said testing unit configured for impressing an alternating current and a direct current one of simultaneously or alternatively.

2. The charging system according to claim 1, wherein said testing unit is configured to impress the predetermined test current into said test winding at predetermined instants.

3. The charging system according to claim 1, wherein said testing unit is configured to impress the direct current as a pulsed direct current into said test winding as the predetermined test current.

4. The charging system according to claim 1, further comprising a switching device for electrically isolating at least one electrical conductor.

5. The charging system according to claim 4, wherein said control device has a rating unit for rating the electric current detected using said detection unit and for actuating said switching device on a basis of the rating.

6. The charging system according to claim 1, wherein said control device has a processing unit for at least one of filtering or amplifying the electric current flowing through said evaluation coil.

* * * * *